United States Patent
Liu et al.

(10) Patent No.: US 7,871,923 B2
(45) Date of Patent: Jan. 18, 2011

(54) SELF-ALIGNED AIR-GAP IN INTERCONNECT STRUCTURES

(75) Inventors: Chung-Shi Liu, Hsin-Chu (TW); Chen-Hua Yu, Hsin-Chu (TW)

(73) Assignee: Taiwan Semiconductor Maufacturing Company, Ltd., Hsin-Chu (TW)

( * ) Notice: Subject to any disclaimer, the term of this patent is extended or adjusted under 35 U.S.C. 154(b) by 885 days.

(21) Appl. No.: 11/698,565

(22) Filed: Jan. 26, 2007

(65) Prior Publication Data

US 2008/0182405 A1    Jul. 31, 2008

(51) Int. Cl.
*H01L 21/4763* (2006.01)

(52) U.S. Cl. .................. 438/622; 438/623; 438/624; 438/625; 438/626

(58) Field of Classification Search .......... 438/622–626
See application file for complete search history.

(56) References Cited

U.S. PATENT DOCUMENTS

| | | | |
|---|---|---|---|
| 6,252,290 B1* | 6/2001 | Quek et al. ................ 257/522 |
| 6,346,484 B1 | 2/2002 | Cotte et al. | |
| 6,380,106 B1 | 4/2002 | Lim et al. | |
| 6,403,461 B1* | 6/2002 | Tae et al. .................... 438/619 |
| 6,815,329 B2* | 11/2004 | Babich et al. ............... 438/619 |
| 7,078,352 B2 | 7/2006 | Beyer et al. | |
| 7,405,147 B2* | 7/2008 | Edelstein et al. ............ 438/618 |
| 7,662,722 B2* | 2/2010 | Stamper et al. ............. 438/719 |
| 2002/0127844 A1* | 9/2002 | Grill et al. .................... 438/622 |
| 2005/0184397 A1* | 8/2005 | Gates et al. .................. 257/774 |
| 2007/0257368 A1* | 11/2007 | Hussein et al. .............. 257/758 |
| 2008/0166870 A1* | 7/2008 | Huang et al. ................ 438/619 |

OTHER PUBLICATIONS

Daamen, R., et al., "Air Gap Integration for the 45nm Node and Beyond," IEEE, 2005, pp. 240-242.
Gossett, L. G., et al., "General Review of Issues and Perspectives for Advanced Copper Interconnections Using Air Gap as Ultra-low K Material," IEEE, 2003, pp. 65-67.
Zhao, X.S., et al., "Characterization of the structural and surface properties of chemically modified MCM-41 material," Micorporous and Mesoporous Materials 41, 2000, pp. 37-47.

* cited by examiner

*Primary Examiner*—Matthew C Landau
*Assistant Examiner*—James M Mitchell
(74) *Attorney, Agent, or Firm*—Slater & Matsil, L.L.P.

(57) ABSTRACT

An integrated circuit structure comprising an air gap and methods for forming the same are provided. The integrated circuit structure includes a conductive line; a self-aligned dielectric layer on a sidewall of the conductive line; an air-gap horizontally adjoining the self-aligned dielectric layer; a low-k dielectric layer horizontally adjoining the air-gap; and a dielectric layer on the air-gap and the low-k dielectric layer.

18 Claims, 7 Drawing Sheets

SELF-ALIGNED AIR-GAP IN INTERCONNECT STRUCTURES

TECHNICAL FIELD

This invention relates generally to integrated circuits, and more particularly to interconnect structures having air-gaps and methods for forming the same.

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductors, increased power consumption, and an increase in the resistive-capacitive (RC) time constant. Therefore, the continual improvement in semiconductor IC performance and functionality is dependent upon developing materials with low k values.

Since the material with lowest dielectric constant is air (k=1.0), low-k dielectric materials typically comprise porous materials. Furthermore, air-gaps are formed to further reduce effective k value of interconnect structures.

FIGS. 1A through 1C illustrate a conventional process for forming an interconnect structure with air-gaps. Referring to FIG. 1A, copper lines 4 and corresponding diffusion barrier layers (not shown) are formed in an inter-metal dielectric 6, which has a low k value, and contains a high concentration of carbon. During the formation of copper lines 4, portions 8 of inter-metal dielectric 6, which are exposed during the formation of copper lines 4, are damaged, and hence have a low concentration of carbon. The damaged portions 8 may be etched by HF to form air-gaps 10, as illustrated in FIG. 1B. Subsequently, as shown in FIG. 1C, dielectric layer 11 is formed, hence sealing air-gaps 10.

Although the formation of air-gaps 10 reduces the parasitic capacitance of the interconnect structure, the conventional process suffers drawbacks. Due to the formation of air-gaps 10, no dielectric layer is formed against sidewalls of copper lines 4. Without the back-pressure provided by the dielectric layer, electro-migration (EM) increases, and time dependent dielectric breakdown (TDDB) performance of the interconnect structure is adversely affected. A further problem is that in subsequent processes for forming overlying vias on the copper lines 4, if a misalignment occurs, the vias may land on air-gaps 10, resulting in discontinuity of the diffusion barrier layer. This causes copper to be in direct contact with low-k inter-metal dielectric layer 6, hence the diffusion of copper into low-k inter-metal dielectric layer 6.

Accordingly, what is needed in the art is an interconnect structure that may incorporate air-gaps thereof to take advantage of the benefits associated with reduced parasitic capacitances while at the same time overcoming the deficiencies of the prior art.

SUMMARY OF THE INVENTION

In accordance with one aspect of the present invention, a method for forming an integrated circuit structure includes forming a low-k dielectric layer; forming a conductive line in the low-k dielectric layer; forming a self-aligned dielectric layer, wherein the conductive line and the self-aligned dielectric layer horizontally adjoin each other; forming an air-gap horizontally adjoining the self-aligned dielectric layer and the low-k dielectric layer; and forming an etch stop layer on the air-gap and the low-k dielectric layer.

In accordance with another aspect of the present invention, a method for forming an integrated circuit structure includes forming a low-k dielectric layer; etching the low-k dielectric layer to form an opening, wherein an exposed portion of the low-k dielectric layer to the opening forms a damaged layer; silylating a surface portion of the damaged layer to form a self-aligned dielectric layer, wherein an inner portion of the damaged layer is not silylated; forming a conductive line in the opening; removing the inner portion of the damaged layer to form an air-gap; and forming an etch stop layer on the air-gap and the low-k dielectric layer.

In accordance with yet another aspect of the present invention, an integrated circuit structure includes a conductive line; a self-aligned dielectric layer on a sidewall of the conductive line; an air-gap horizontally adjoining the self-aligned dielectric layer; a low-k dielectric layer horizontally adjoining the air-gap; and a dielectric layer on the air-gap and the low-k dielectric layer.

In accordance with yet another aspect of the present invention, an integrated circuit structure includes a first conductive line; a first self-aligned dielectric layer on a sidewall of the first conductive line; a first air-gap horizontally adjoining the first self-aligned dielectric layer; a second conductive line at a same level as the first conductive line; a second self-aligned dielectric layer on a sidewall of the second conductive line; a second air-gap horizontally adjoining the second self-aligned dielectric layer; and a low-k dielectric layer adjoining the first and the second air-gaps.

In accordance with yet another aspect of the present invention, an integrated circuit structure includes a first low-k dielectric layer; a via in the first low-k dielectric layer; a first self-aligned dielectric layer on a sidewall of the via; a damaged layer adjoining the first self-aligned dielectric layer and the first low-k dielectric layer, wherein the damaged layer has a higher k value than the first self-aligned dielectric layer and the first low-k dielectric layer; a second low-k dielectric layer over the first low-k dielectric layer; a conductive line in the second low-k dielectric layer and contacting the via; a second self-aligned dielectric layer on a sidewall of the conductive line; an air-gap horizontally adjoining the second self-aligned dielectric layer and the second low-k dielectric layer; and a first etch stop layer on the air-gap and the second low-k dielectric layer.

The advantageous features of the present invention include reduced parasitic capacitance, reduced electro-migration and improved time dependent dielectric breakdown.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention provides interconnect structures with air-gaps and self-aligned dielectric layers, which act as sidewall spacers, and methods for forming the same. The intermediate stages of manufacturing preferred embodiments of the present invention are illustrated. Throughout the various views and illustrative embodiments of the present invention, like reference numbers are used to designate like elements.

Figure 1A:
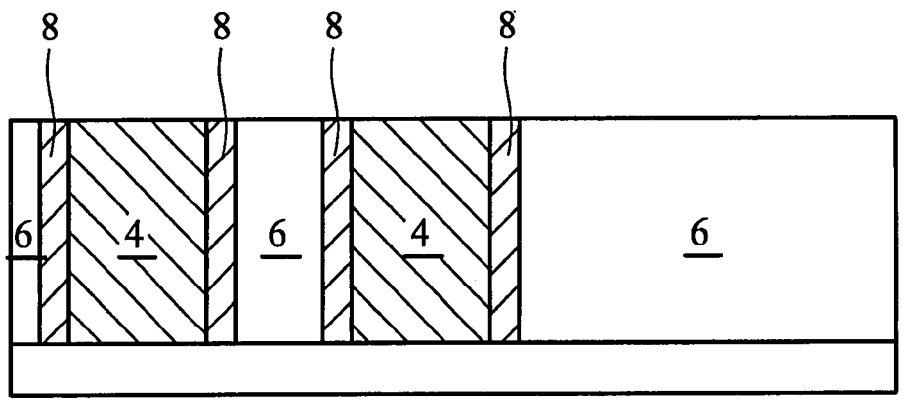
FIGS. 1A, 1B and 1C illustrate a conventional process for forming air-gaps, wherein damaged low-k dielectric portions are etched to form air-gaps.
Figure 1B:
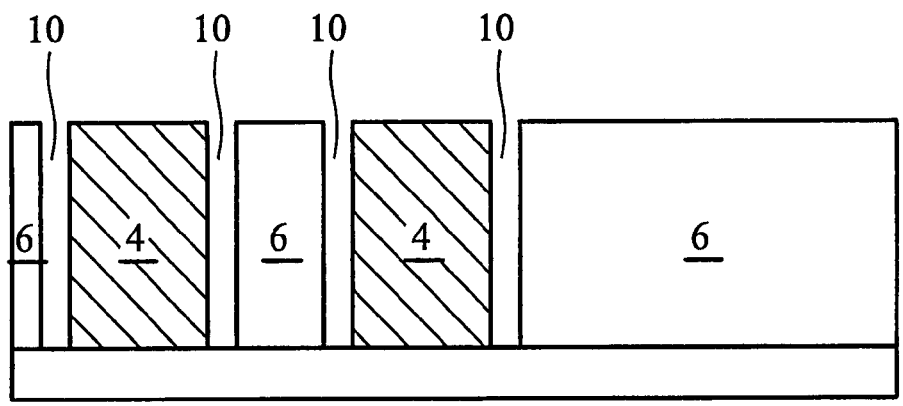
Figure 1C:
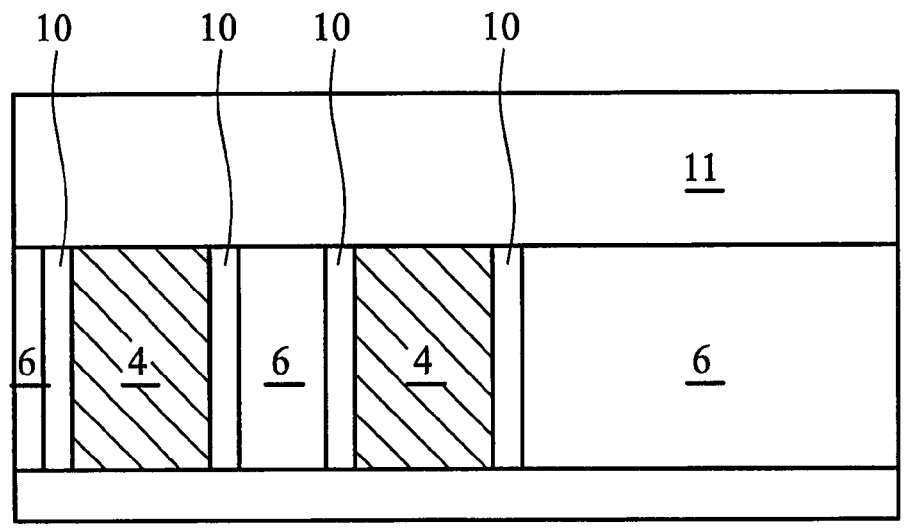
Figure 2:
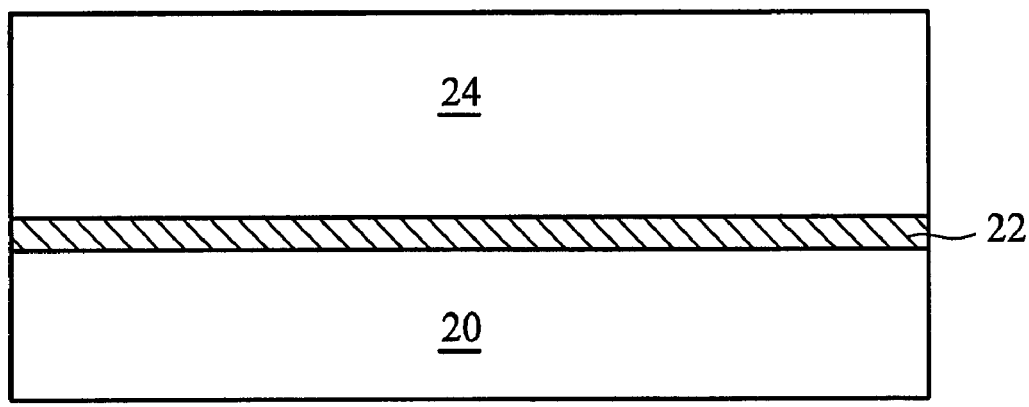
FIGS. 2 through 7 are cross-sectional views of intermediate stages in the manufacturing of an embodiment of the present invention, wherein a single damascene structure is formed.

FIGS. 2 through 7 are cross-sectional views of intermediate stages in an embodiment for forming a single damascene structure. FIG. 2 illustrates a starting structure, which includes etch stop layer (ESL) 22 on base layer 20, and dielectric layer 24 on ESL 22. Base layer 20 is used to symbolize a semiconductor substrate and other layers between ESL 22 and the semiconductor substrate, wherein the semiconductor substrate may include a single crystalline or a compound semiconductor material. Active devices (not shown) such as transistors may be formed on the semiconductor substrate. Conductive features (not shown), such as metal lines in metallization layers, contact plugs or vias, may be included in base layer 20 and connected to the subsequently formed vias and conductive lines. ESL 22 may be formed on an inter-layer dielectric or an inter-metal dielectric.

ESL 22 preferably has a dielectric constant of less than about 4.0, and may comprise materials such as SiC, SiCN, SiCO, SiN, carbon-based materials, and combinations thereof. ESL 22 has different etching characteristics from the overlying dielectric layer 24.

In an exemplary embodiment, dielectric layer 24 has a low dielectric constant (k value), preferably lower than about 3.0, hence is referred to as low-k dielectric layer 24 throughout the description. More preferably, low-k dielectric layer 24 has a k value of less than about 2.5, and hence is sometimes referred to as an extreme low-k (ELK) dielectric layer. Low-k dielectric layer 24 may include commonly used materials such as carbon-containing dielectric materials, and may further contain nitrogen, hydrogen, oxygen, and combinations thereof. A porous structure may be used for lowering the k value. The preferred thickness of low-k dielectric layer 24 is between about 1000 Å and about 3500 Å. One skilled in the art will realize, however, that the dimensions recited throughout the description are related to the technology used for forming the integrated circuits, and will reduce with the down-scaling of the technology.

Figure 3:
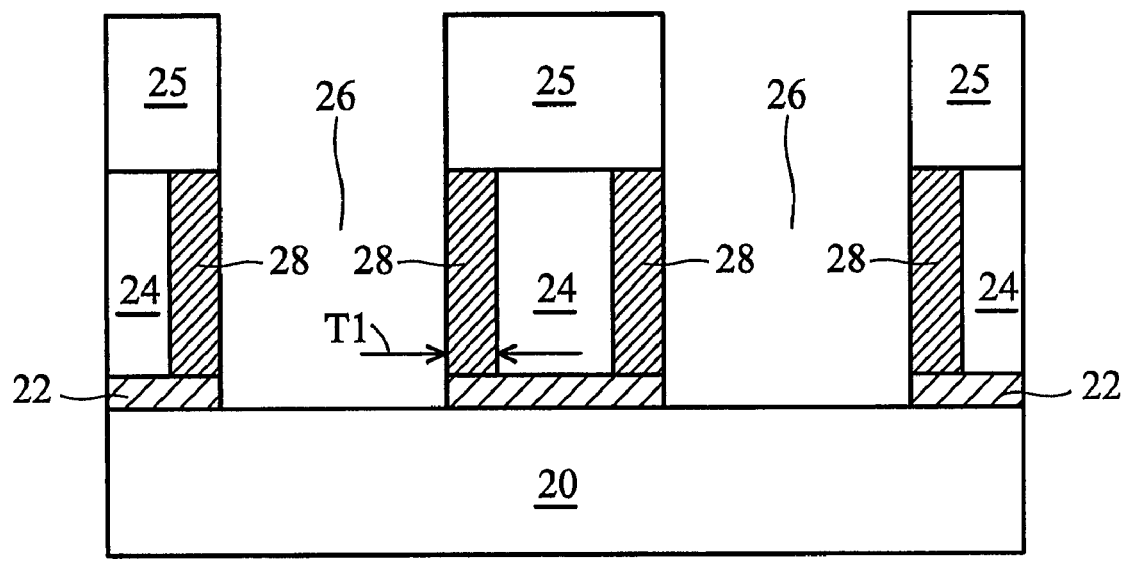

FIG. 3 illustrates the formation of trenches 26, which are preferably formed by applying and patterning photoresist 25, and then etching low-k dielectric layer 24. The exposed ESL 22 is then etched. Photoresist 25 is then removed. During the formation of trenches 26, surface portions of low-k dielectric layer 24 that are exposed to trenches 26 are damaged by the etching process and subsequent ashing process for removing photoresist 25. Since low-k dielectric layer 24 comprises carbon, the etching process causes carbon to be depleted from the exposed surface portions of low-k dielectric layer 24, forming damaged layers 28. In an exemplary embodiment, low-k dielectric layer 24 includes Si—O—$CH_3$ terminals, and the etching and ashing processes cause the loss of $CH_3$ terminals, and the generation of O—H terminals. As a result, the k value of the damaged layers 28 is adversely increased over the undamaged portion of low-k dielectric layer 24.

The etchants that are used to form trenches 26 may include oxygen-containing etchants, such as a combined gas of $CF_4$ and $O_2$, or oxygen-less etchants, such as $C_4F_8$, $CH_2F_2$, and $N_2$. Thickness T1 of damaged layers 28 is related to the etchants and the etching process, such as the etching duration. In an exemplary embodiment, thickness T1 of damaged layers 28 is preferably between about 200 Å and 300 Å. If thickness T1 is less than desired, it may be reduced by using oxygen-less etchants, or by reducing oxygen percentage in etchants. Conversely, if thickness T1 is greater than desired, either oxygen-containing etchants may be used instead of oxygen-less etchants, or the percentage of oxygen may be increased to increase thickness T1.

Figure 4:
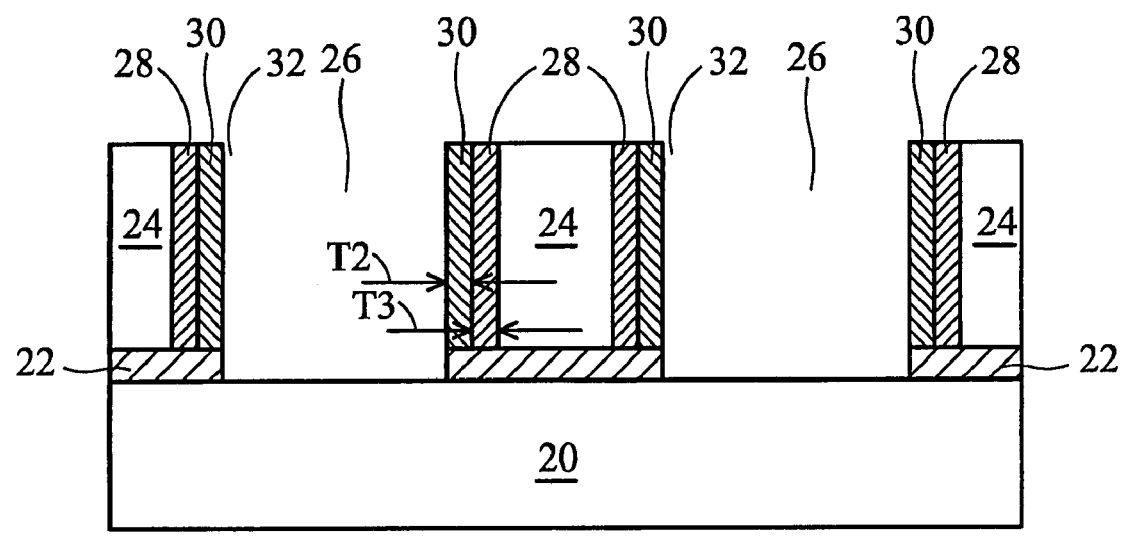

FIG. 4 illustrates the formation of self-aligned dielectric layers 30. In the preferred embodiment, self-aligned dielectric layers 30 are formed by a silylation process. In an embodiment, the structure shown in FIG. 3 is submerged in a silane agent, which is in the form of liquid. Exemplary silane agents include hexamethyldisiloxan (HMDS), trimethylchlorsilan (TMCS), and combinations thereof. During the silylation process, the liquid silane agents may be at room temperature, or an elevated temperature. In other embodiments, the silane agents may be in the form of gas. In an exemplary embodiment, the wafer that includes the structure shown in FIG. 3 is placed in a chamber, and gaseous silane agents are introduced. The wafer is preferably heated, for example, to a temperature of between about 100° C. and about 450° C. During the silylation process, the surface portions of damaged layers 28 are repaired (restored). For example, the O—H bonds in damaged layers 28 may be replaced by O—Si—$(CH_3)_3$ bonds, and hence the k value of surface portions of damaged layers 28 is reduced, resulting in the self-aligned dielectric layers 30, which are substantially aligned with the original boundary of trenches 26. The thickness T2 of self-aligned dielectric layers 30 is preferably less than T1, and may be controlled by adjusting the silylation process, such as the duration, the temperature, and the like. The remaining portions of damaged layers 28 preferably have a thickness T3 of greater than about 100 Å, and more preferably between about 100 Å and about 200 Å.

In alternative embodiments, other agents different than the silane agents may be used to restore surfaces layers of damaged layers 28, as long as the resulting self-aligned dielectric layers 30 have different etching characteristics from damaged layers 28. The agents may comprise terminals such as $C_2H_5$, $C_3H_7$, and the like. Similarly, the resulting self-aligned dielectric layers 30 have a low-k value, for example, less than about 3.0.

Figure 5:
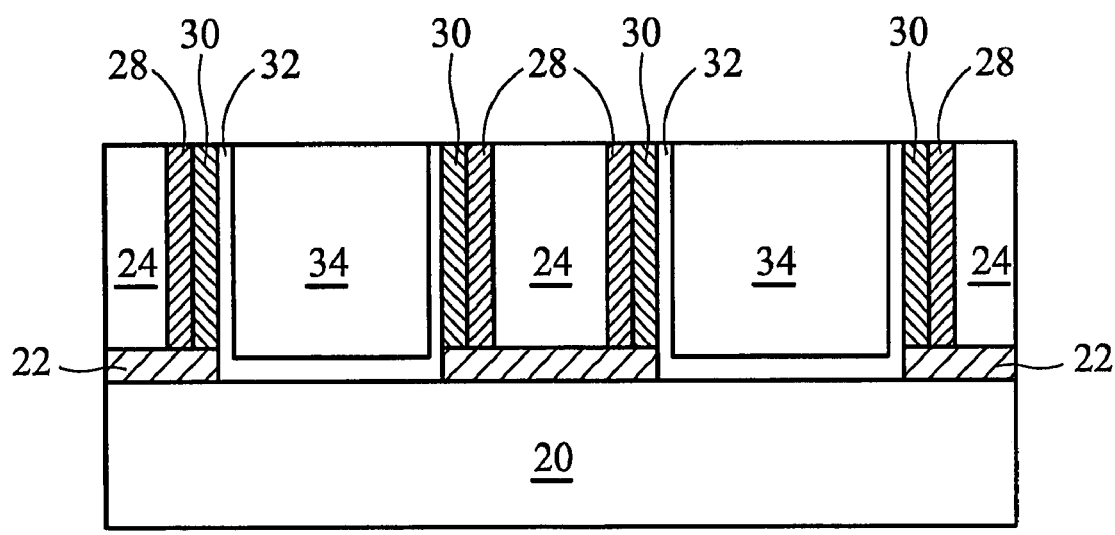

FIG. 5 illustrates the formation of conductive lines, including diffusion barrier layers 32 and metal lines 34, in trenches 26. Diffusion barrier layers 32 preferably include titanium, titanium nitride, tantalum, tantalum nitride, or other alternatives, and may be formed using physical vapor deposition (PVD) or one of the chemical vapor deposition (CVD) methods. The thickness of diffusion barrier layers 32 may be between about 20 Å and about 200 Å.

Metal lines 34 preferably include copper or a copper alloy, although it may include other conductive materials, such as silver, gold, tungsten, aluminum, and the like. As is known in the art, the steps for forming metal lines 34 may include blanket depositing a thin seed layer of copper or copper alloy on diffusion barrier layers 32. A conductive material is then filled into trenches 26, preferably by plating. A chemical mechanical polish (CMP) is then performed to remove the excess diffusion barrier layer and conductive material on low-k dielectric layer 24, leaving diffusion barrier layers 32 and copper metal lines 34 only in trenches 26.

Figure 6:
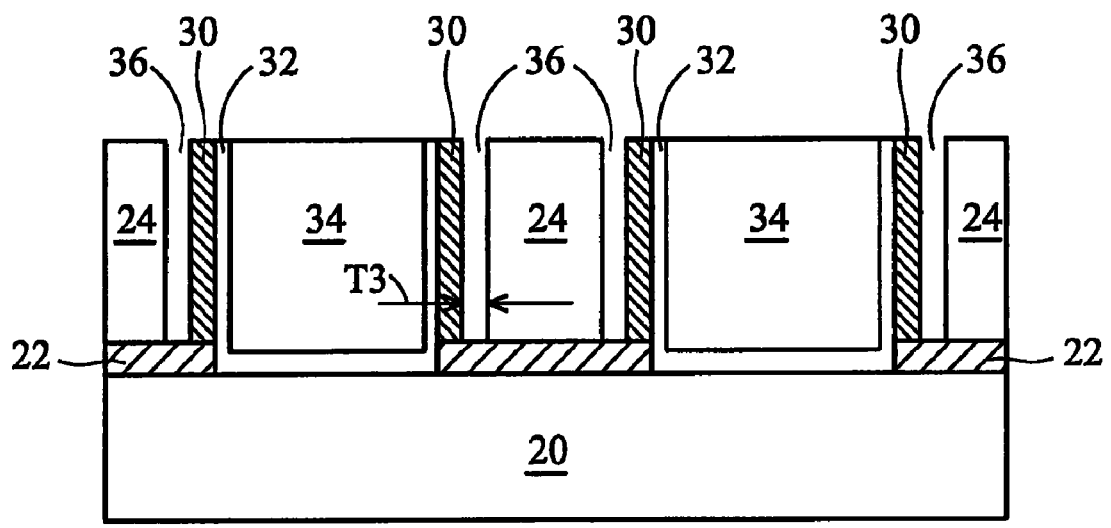

FIG. 6 illustrates the selective removal of damaged layers 28. In an exemplary embodiment, low-k dielectric layer 24 and self-aligned dielectric layers 30 have higher carbon concentrations, and damaged layers 28 have a lower carbon concentration. Therefore, damaged layers 28 may be selectively removed using diluted HF, forming air-gaps 36. Thickness T3 of air-gaps 36 is preferably between about 100 Å and about 200 Å, although a greater or a smaller thickness is also applicable.

Figure 7:
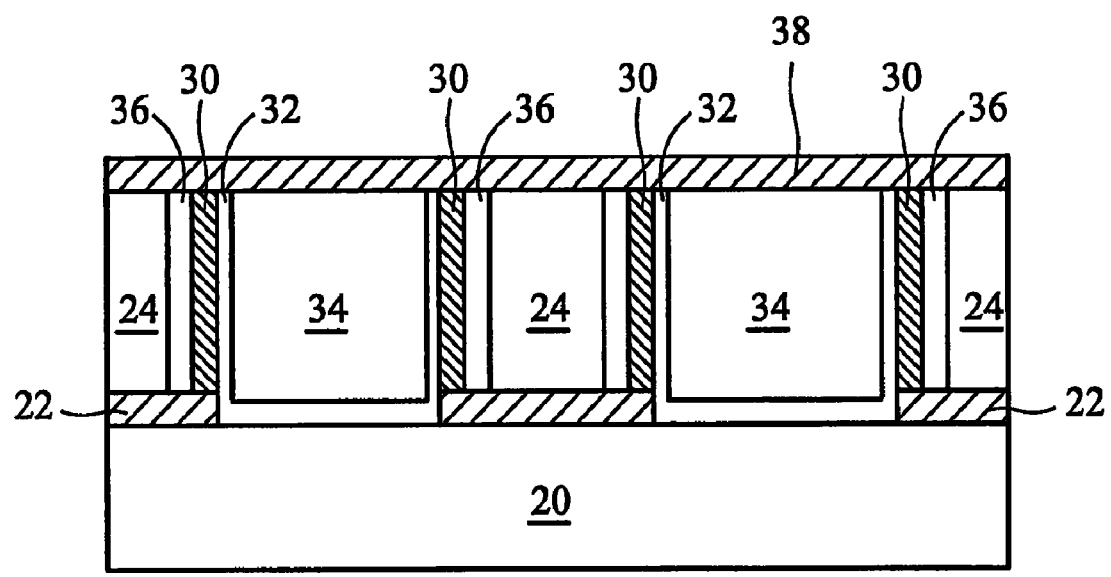

Referring to FIG. 7, etch stop layer (ESL) 38 is formed. Preferably, ESL 38 is formed of SiC, SiCN or other commonly used materials. Air-gaps 36 are thus sealed in the interconnect structure.

Figure 8:
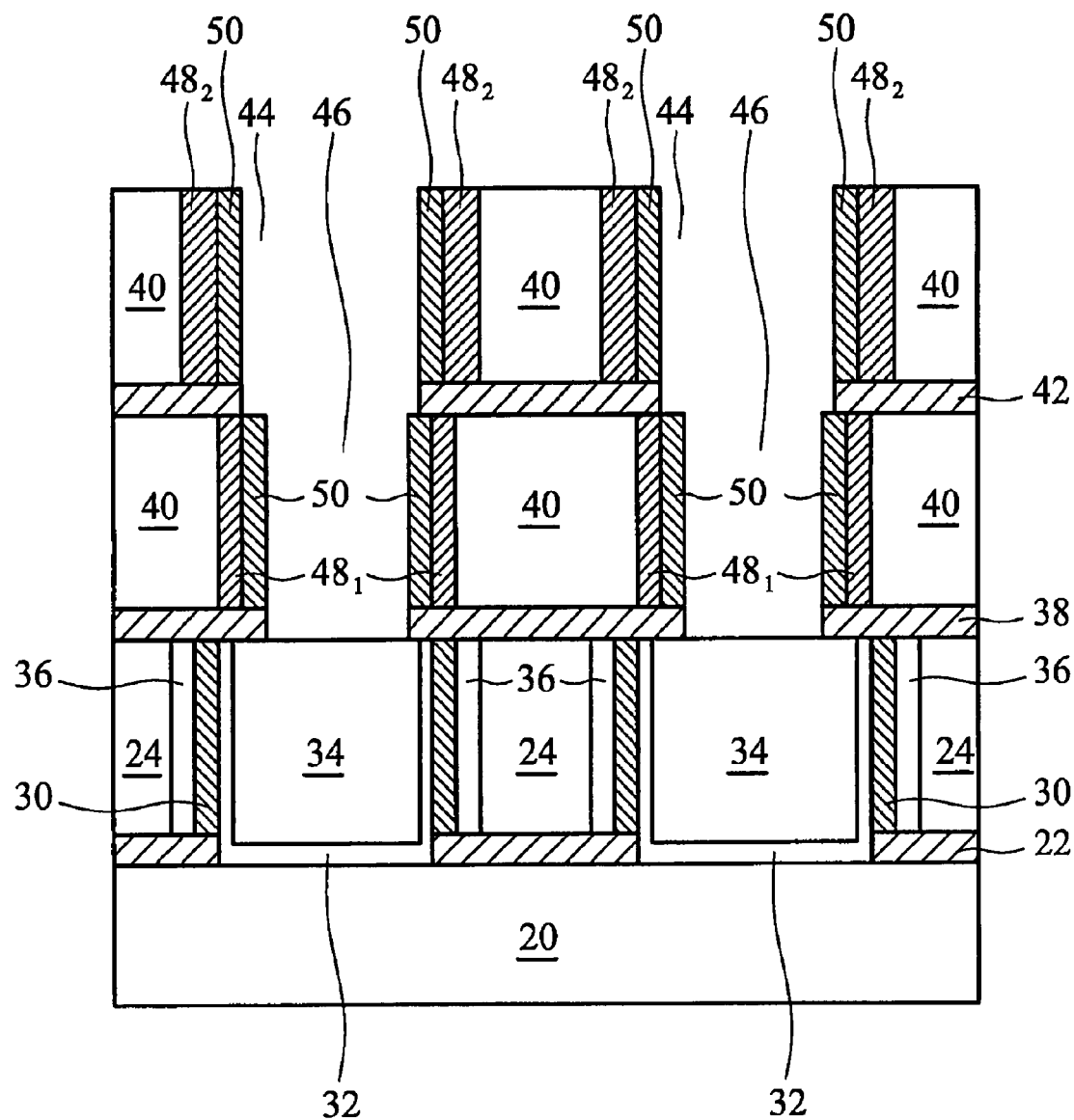
FIGS. 8 through 10 illustrate the formation of a dual damascene structure on the single damascene structure.
Figure 9:
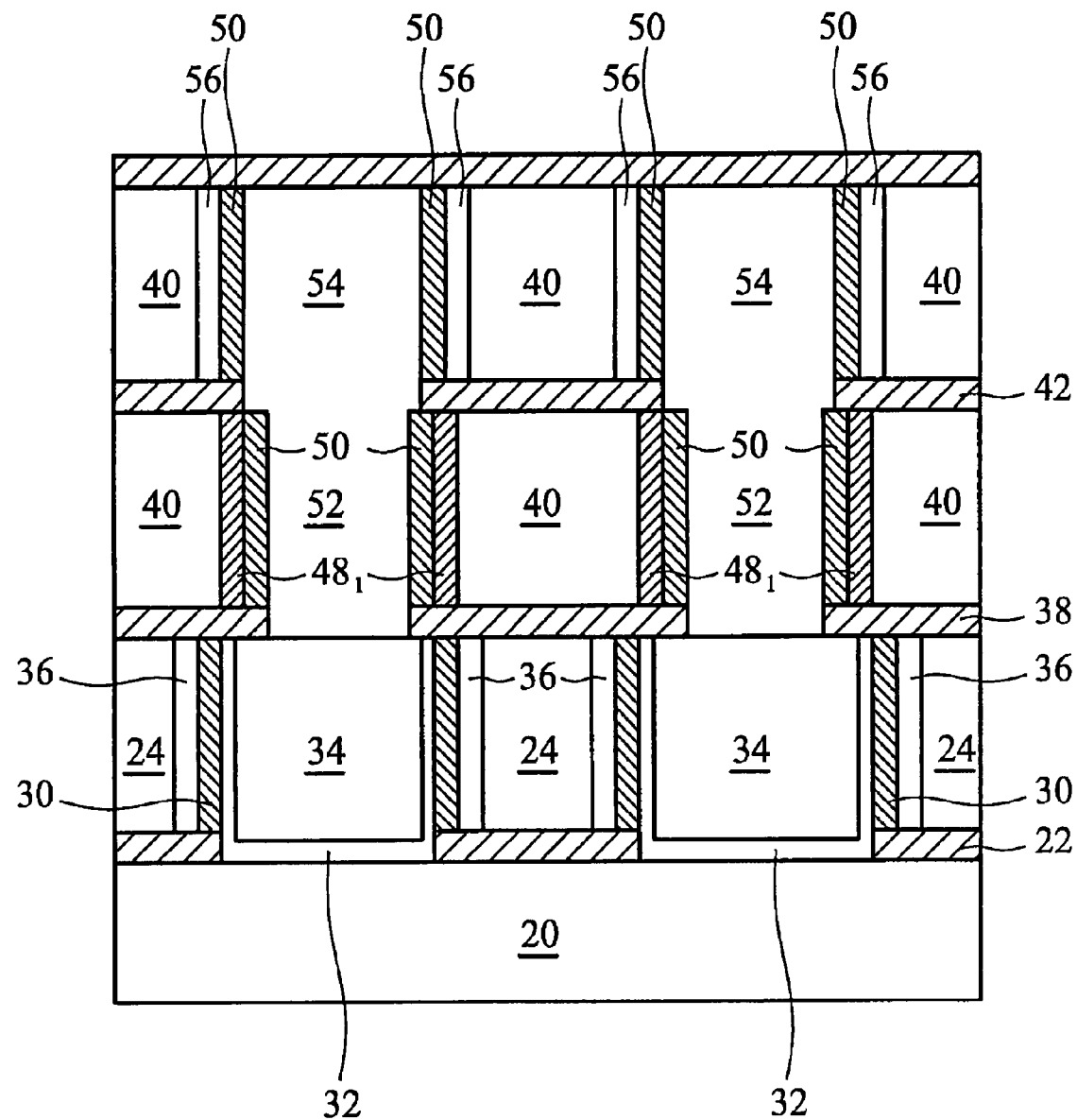

FIGS. 8 and 9 illustrate the formation of a dual damascene structure. Referring to FIG. 8, inter-metal dielectric (IMD) layer 40 is formed, which preferably has a low k value, and may include essentially the same materials as low-k dielectric layer 24. ESL 42 may be optionally formed in IMD layer 40. Trenches 44 and via openings 46 are then formed in IMD layer 40. As is known in the art, photoresists (not shown) need to be formed and patterned over IMD layer 40 to aid the formation of via openings 46 and trenches 44. In the preferred embodiment, an anisotropic etch cuts through IMD layer 40 and stops at ESL 38, thereby forming via openings 46. Trenches 44 are then formed, wherein ESL 42 is used for stopping the etching. In alternative embodiments, a trench-first approach is taken, in which trenches 44 are formed prior to the formation of via openings 46. ESL 38 is then etched through via openings 46, exposing underlying conductive metal lines 34.

Similar to the first embodiment, due to the damage of the etchants, damaged layers 48, which include via portions $48_1$ and trench portions $48_2$, are formed. In subsequent steps, a silylation process is performed, wherein the process is essentially the same as in the first embodiment. The resulting self-aligned dielectric layers 50 have a lower k value than damaged layers 48. In an exemplary embodiment, the silylation process replenishes carbon into damaged layers 48, resulting in a decrease in their k values.

Referring to FIG. 9, vias 52 and conductive lines 54 are formed by filling via openings 46 and trenches 44, respectively. The process details are essentially the same as in the single damascene process, and thus are not repeated herein. Damaged layers $48_2$ (as shown in FIG. 8) are then removed, resulting in air-gaps 56. Due to the masking of ESL 38, the via portions $48_1$ of damaged layers 48 will remain un-removed.

Figure 10:
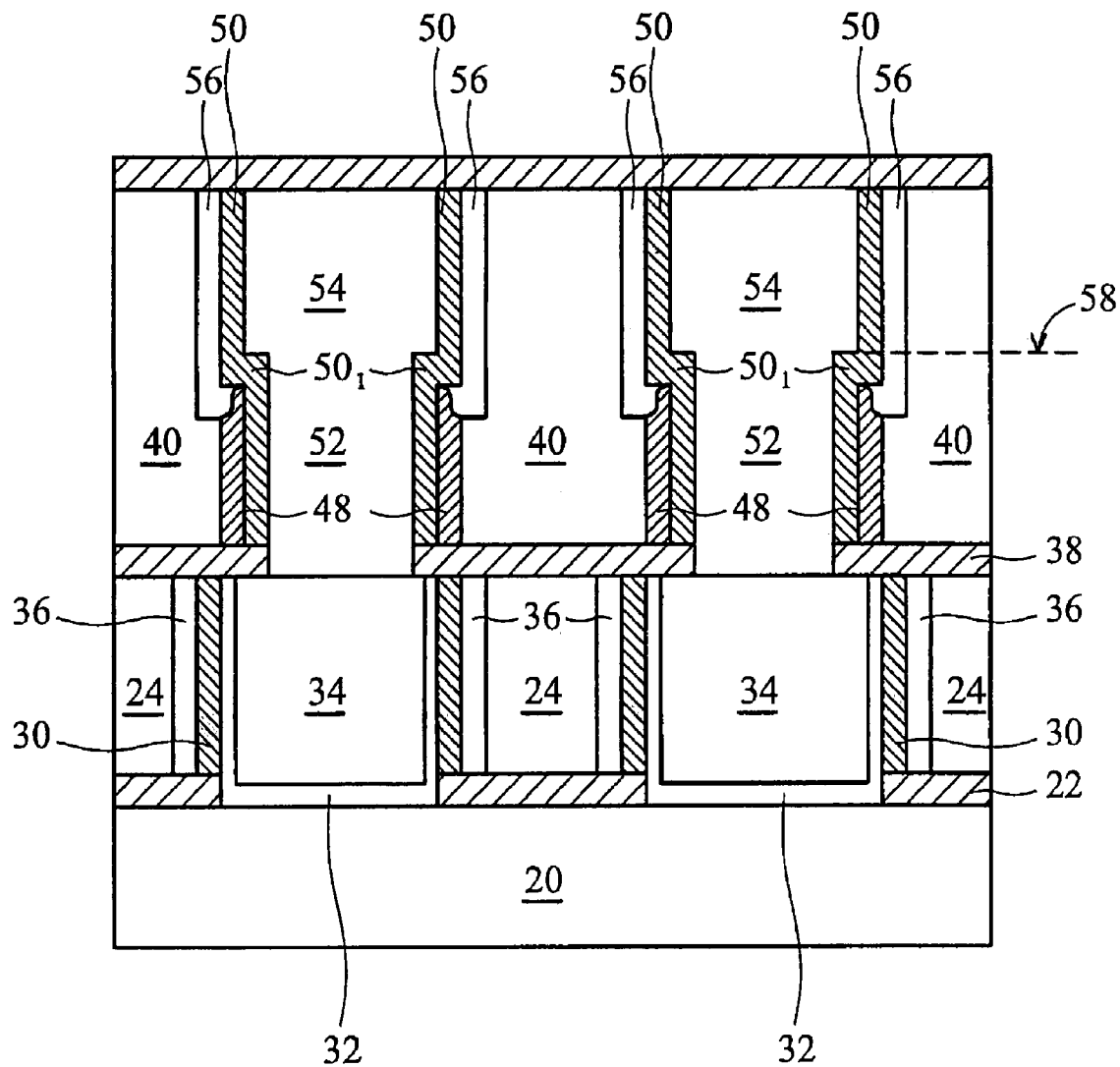

FIG. 10 illustrates an alternative embodiment, which is similar to the embodiment shown in FIG. 9, except ESL 42 is not formed. In this case, air-gaps 56 may extend, at least partially, below top level 58 of vias 52. In this case, even though air-gaps 56, formed below top level 58 of vias 52, have little effect to the reduction of the overall k value, portions $50_1$ of self-aligned dielectric layers 50 help reduce the reliability impact. If the formation of conductive lines 54 misaligns from the desired position, conductive lines 54 may land on portions $50_1$ of self-aligned dielectric layers 50. This reduces the likelihood of HF removing the damaged layer down to Via level, diffusion barrier layer discontinuity and the likelihood of copper diffusion into air-gaps 56.

The embodiments of the present invention have several advantageous features. By forming air-gaps, the equivalent k values of dielectric materials in the interconnect structures are reduced, sometimes to as low as about 2.0. Self-aligned dielectric layers 30 and 50 provide back-pressure to metal lines 34 and conductive lines 54, respectively, and thus electro-migration and time dependent dielectric breakdown (TBBD) performance of the interconnect structure is improved. A further advantageous feature is that in the case vias 52 and conductive lines 54 are misaligned, it is likely that vias 52 and conductive lines 54 will land on self-aligned dielectric layers 30 and 50, respectively, instead of air-gaps 36 or 56. The performance and reliability of the interconnect structure is thus improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
    forming a low-k dielectric layer;
    forming a conductive line in the low-k dielectric layer;
    forming a self-aligned dielectric layer, wherein the conductive line and the self-aligned dielectric layer horizontally adjoin each other;
    forming an air-gap horizontally and directly adjoining the self-aligned dielectric layer and the low-k dielectric layer; and
    forming an etch stop layer on the air-gap and the low-k dielectric layer.

2. A method for forming an integrated circuit structure, the method comprising:
    forming a low-k dielectric layer;
    forming a self-aligned dielectric layer comprising:
        etching the low-k dielectric layer to form an opening, wherein an exposed portion of the low-k dielectric layer forms a damaged layer; and
        restoring a surface portion of the damaged layer to form the self-aligned dielectric layer, wherein an inner portion of the damaged layer is not restored;
    forming a conductive line in the low-k dielectric layer; wherein the conductive line and the self-aligned dielectric layer horizontally adjoin each other;
    forming an air-gap horizontally adjoining the self-aligned dielectric layer and the low-k dielectric layer; and forming an etch stop layer on the air-gap and the low-k dielectric layer.

3. The method of claim 2, wherein the step of forming the air-gap comprises etching the inner portion of the damaged layer.

4. The method of claim 2, wherein the step of restoring the surface portion comprises performing a silylation process to the damaged layer.

5. The method of claim 4, wherein the silylation process comprising reacting the damaged layer with a silane agent.

6. The method of claim 5, wherein the silane agent comprises a material selected from the group consisting essentially of hexamethyldisiloxan (HMDS), trimethylchlorsilan (TMCS), and combinations thereof.

7. The method of claim 4, wherein the silylation process is performed at a temperature higher than room temperature.

8. A method for forming an integrated circuit structure, the method comprising:
   forming a first low-k dielectric layer;
   forming a second low-k dielectric layer over the first low-k dielectric layer;
   forming a conductive line in the second low-k dielectric layer;
   etching the second low-k dielectric layer to form an opening and the first low-k dielectric layer to form a via opening, wherein a first exposed portion of the first low-k dielectric layer forms a first damaged layer, and a second exposed portion of the second low-k dielectric forms a second damaged layer;
   restoring a first surface portion of the first damaged layer to form a first self-aligned dielectric layer and a second surface portion of the second damaged layer to form a second self-aligned dielectric layer, wherein an interior portion of the second damaged layer remains un-restored, and wherein the conductive line and the second self-aligned dielectric layer horizontally adjoin each other;
   forming an air-gap by removing the interior portion of the second damaged layer, wherein the air-gap horizontally adjoins the second self-aligned dielectric layer and the second low-k dielectric layer; and
   forming an etch stop layer on the air-gap and the second low-k dielectric layer.

9. The method of claim 8 further comprising forming an additional etch stop layer between the first low-k dielectric layer and the second low-k dielectric layer, wherein the first damaged layer is not removed.

10. The method of claim 8, wherein the second low-k dielectric layer and the first low-k dielectric layer are portions of a continuous layer, and wherein the step of forming the air-gap continues until the air-gap extends into a top portion of the first damaged layer.

11. A method for forming an integrated circuit structure, the method comprising:
   forming a low-k dielectric layer;
   etching the low-k dielectric layer to form an opening, wherein an exposed portion of the low-k dielectric layer in the opening forms a damaged layer;
   silylating a surface portion of the damaged layer to form a self-aligned dielectric layer, wherein an inner portion of the damaged layer is not silylated;
   forming a conductive line in the opening;
   removing the inner portion of the damaged layer to form an air-gap; and
   forming an etch stop layer on the air-gap and the low-k dielectric layer.

12. The method of claim 11, wherein the step of silylating comprises reacting the damaged layer with a silane agent.

13. The method of claim 12, wherein the silane agent comprises a material selected from the group consisting essentially of hexamethyldisiloxan (HMDS), trimethylchlorsilan (TMCS), and combinations thereof.

14. The method of claim 12, wherein the silylation process is performed at a temperature close to or higher than room temperature.

15. The method of claim 12, wherein the silane agent is a gas or a liquid.

16. The method of claim 12 further comprising:
   forming an additional low-k dielectric layer underlying the low-k dielectric layer;
   etching the additional low-k dielectric layer to form a via opening, wherein an exposed portion of the additional low-k dielectric layer forms an additional damaged layer; and
   silylating a surface portion of the additional damaged layer to form an additional self-aligned dielectric layer, wherein an inner portion of the additional damaged layer is not silylated, and wherein the step of removing the inner portion of the damaged layer continues until a top portion of the inner portion of the additional damaged layer is removed.

17. The method of claim 11 further comprising:
   forming an additional low-k dielectric layer underlying the low-k dielectric layer;
   forming an additional etch stop layer between the low-k dielectric layer and the additional low-k dielectric layer; and
   etching the additional low-k dielectric layer to form a via opening, wherein an exposed portion of the additional low-k dielectric layer forms an additional damaged layer, and wherein the additional damaged layer is not removed.

18. The method of claim 11, wherein the damaged layer comprises substantially less carbon than the low-k dielectric layer.

* * * * *